(12) United States Patent
Park et al.

(10) Patent No.: US 7,307,818 B1
(45) Date of Patent: Dec. 11, 2007

(54) METHOD AND SYSTEM FOR PROVIDING A STABLE SPIN FILTER

(75) Inventors: Chang-Man Park, Mountain View, CA (US); Shin Funada, Pleasanton, CA (US); Amritpal S. Rana, Union City, CA (US); Lena Miloslavsky, Sunnyvale, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 529 days.

(21) Appl. No.: 10/837,381

(22) Filed: Apr. 30, 2004

(51) Int. Cl.
*G11B 5/39* (2006.01)
*G11B 5/127* (2006.01)

(52) U.S. Cl. .................... 360/324.1; 360/324.12
(58) Field of Classification Search ............ 360/324.1, 360/324.11, 324.12, 324.2
See application file for complete search history.

(56) References Cited

U.S. PATENT DOCUMENTS

| | | | |
|---|---|---|---|
| 6,586,121 B2* | 7/2003 | Ide et al. ............. | 428/811.3 |
| 6,587,316 B2 | 7/2003 | Hasegawa | |
| 6,738,237 B2* | 5/2004 | Gill ..................... | 360/324.11 |
| 2001/0013999 A1* | 8/2001 | Koi et al. ............ | 360/324.11 |
| 2002/0006530 A1* | 1/2002 | Ide et al. ............. | 428/692 |
| 2002/0048690 A1* | 4/2002 | Fukuzawa et al. .... | 428/692 |
| 2002/0126426 A1* | 9/2002 | Gill ..................... | 360/324.12 |
| 2004/0034991 A1 | 2/2004 | Pinarbasi | |

* cited by examiner

*Primary Examiner*—William J Klimowicz
(74) *Attorney, Agent, or Firm*—Strategic Patent Group

(57) ABSTRACT

A method and system for providing a spin filter is disclosed. The method and system include providing a pinned layer, a free layer, and a conductive nonmagnetic spacer layer between the pinned layer and the free layer. The method and system also include providing a spin filter layer and a capping layer on the spin filter layer. The spin filter layer is adjacent to the free layer. The spin filter layer is on an opposite side of the free layer as the nonmagnetic spacer layer and includes at least Pt and/or Rh. The capping layer has a specular reflection layer therein. In one aspect, the specular reflection layer allows specular reflection of current carriers traveling from the spin filter layer to the specular reflection layer. In another aspect, the specular reflection layer includes at least Ta, Ti, Zr, Hf, Nb, Al, Mo, W, Si, Cr, V, Ni, Co, and Fe.

21 Claims, 5 Drawing Sheets

METHOD AND SYSTEM FOR PROVIDING A STABLE SPIN FILTER

FIELD OF THE INVENTION

The present invention relates to magnetic recording technology, and more particularly to a method and system for providing an improved spin filter.

BACKGROUND OF THE INVENTION

In the drive toward higher density recording media, spin filters have become of interest for use in magnetoresistive (MR) read heads. FIG. 1 is a diagram of a conventional spin filter 10 that may be used in reading high density recording media. In general, the conventional spin filter 10 would be incorporated into a MR read head (not explicitly shown), which would include leads and other electronics to drive current through the conventional spin filter 10 during reading. In such an application, current is generally driven in the current perpendicular to the plane (CPP) configuration. The CPP configuration is in the z-direction depicted in FIG. 1.

The conventional spin filter 10 includes a conventional seed layer 20, a conventional antiferromagnetic (AFM) layer 30, a conventional pinned layer 40, a conventional nonmagnetic spacer layer 50, a conventional free layer 60, a conventional diffusion barrier 70, a Cu layer 80, and a conventional capping layer 90. The conventional seed layer 20 is used to provide the appropriate surface for growing the conventional AFM layer 30 with the desired crystal structure. The conventional AFM layer 30 is used in pinning the magnetization of the conventional pinned layer 40. The conventional pinned layer 40 may be a synthetic pinned layer, including conventional ferromagnetic layers 42 and 46 separated by a conductive spacer layer 44 that is typically Ru. The conductive spacer layer 44 has a thickness configured to ensure that the ferromagnetic layers 42 and 46 are antiferromagnetically coupled. The conventional nonmagnetic spacer layer 50 is typically conductive, for example Cu. The conventional free layer 60 is ferromagnetic. The conventional free layer 60 may be a bilayer, including a lower CoFe layer and a NiFe layer on the CoFe layer. The Cu layer 80 is a conventional spin filter layer. The Cu layer 80 is a conventional spin filter layer because the Cu layer 80 improves the scattering of electrons from the free layer 60 that are incident on the capping layer 90, discussed above. The capping layer 90 is typically Ta. After formation, an upper portion of the Ta capping layer 90 oxidizes, providing a specular reflection layer (not explicitly shown) within the upper portion of the capping layer 90. Also included is a Ru diffusion barrier 70 between the free layer 60 and the Cu layer 80.

Although the conventional spin filter 10 functions, one of ordinary skill in the art will readily recognize that there are drawbacks to the use of the conventional spin filter 10. Oxygen may diffuse through the Ta layer 90 and the Cu layer 80. In the absence of the Ru diffusion barrier 70, this oxygen may reach the free layer 60 and degrade the thermal stability of the conventional spin filter 10. Although the Ru diffusion barrier 70 prevents oxygen from reaching the free layer 60, one of ordinary skill in the art will readily recognize that there are issues with the use of the Ru diffusion barrier 70. In particular, the resistance of the spin filter is lowered because of the relationship between the materials Ru and Cu. Other conventional approaches substitute materials such as Ag and Au for the Cu layer 80 and omit the Ru diffusion barrier 70. However, one of ordinary skill in the art will readily recognize that such conventional spin filters are subject to interdiffusion with the NiFe layer at the top of the free layer 60. Consequently, the signal from such a may be reduced.

U.S. Pat. No. 6,586,121 (Ide) discloses another conventional spin filter. In the conventional spin filter of Ide, the Cu layer 80 and the capping layer 90 are replaced by layers composed of at least one of Ru, Pt, Ir, Rh, Pd, Os, and Cr. Although such a conventional spin filter may address some of the issues described above, the signal from such a spin filter may be degraded.

Accordingly, what is needed is a system and method for providing a spin filter having improved thermal stability while preserving the signal for the conventional spin filter. The present invention addresses such a need.

SUMMARY OF THE INVENTION

The present invention provides a method and system for providing a spin filter. The method and system comprise providing a pinned layer, providing a free layer, and providing a conductive nonmagnetic spacer layer residing between the pinned layer and the free layer. The method and system also comprise providing a spin filter layer and a capping layer on the spin filter layer. The spin filter layer is adjacent to the free layer. The spin filter layer is also on an opposite side of the free layer as the nonmagnetic spacer layer and includes at least one material selected from the group consisting of Pt and Rh. The capping layer has a specular reflection layer therein. In one aspect, the specular reflection layer is configured to allow specular reflection of current carriers traveling from the spin filter layer to the specular reflection layer. In another aspect, the specular reflection layer includes at least one material selected from a group consisting of Ta, Ti, Zr, Hf, Nb, Al, Mo, W, Si, Cr, V, Ni, Co, and Fe.

According to the system and method disclosed herein, the present invention provides a stable spin filter.

DETAILED DESCRIPTION OF THE INVENTION

The present invention relates to an improvement in magnetic recording technology. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a spin filter. The method and system comprise providing a pinned layer, providing a free layer, and providing a conductive nonmagnetic spacer layer residing between the pinned layer and the free layer. The method and system also comprise providing a spin filter layer and a capping layer on the spin filter layer. The spin filter layer is adjacent to the free layer. The spin filter layer is also on an opposite side of the free layer as the nonmagnetic spacer layer and includes at least one material selected from the group consisting of Pt and Rh. The capping layer has a specular reflection layer therein. In one aspect, the specular reflection layer is configured to allow specular reflection of current carriers traveling from the spin filter layer to the specular reflection layer. In another aspect, the specular reflection layer includes at least one material selected from a group consisting of Ta, Ti, Zr, Hf, Nb, Al, Mo, W, Si, Cr, V, Ni, Co, and Fe.

The present invention will be described in terms of a spin filter including certain material and particular layers. However, one of ordinary skill in the art will readily recognize that this method and system will operate effectively for other spin filters including different and/or additional layers and materials not inconsistent with the present invention. Furthermore, the present invention is described in the context of a spin filter which is used in a CPP configuration. However, one of ordinary skill in the art will readily realize that the method and system operate effectively for other configurations.

Figure 2:
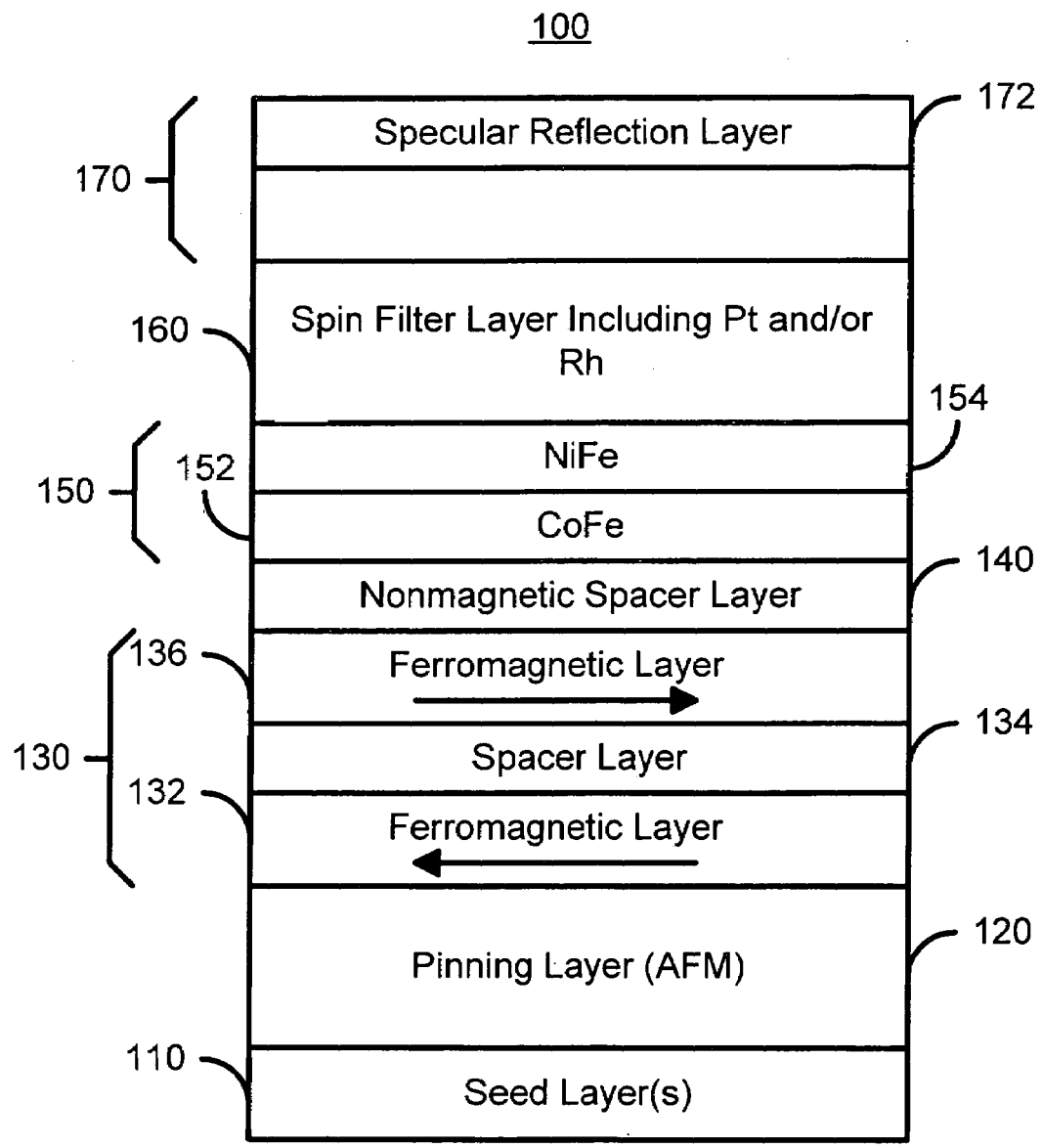
FIG. 2 is a diagram of one embodiment of a spin filter in accordance with the present invention.

To more particularly illustrate the method and system in accordance with the present invention, refer now to FIG. 2, depicting one embodiment of a spin filter 100 in accordance with the present invention. The spin filter 100 includes a pinning layer 120, pinned layer 130, nonmagnetic spacer layer 140, a free layer 150, a spin filter layer 160, and a capping layer 170. The spin filter 100 may also include seed layer(s) 110 used to ensure that the pinning layer 120 has the desired crystal structure and, therefore, magnetic properties.

The pinning layer 120 is generally an AFM layer. The AFM materials used in the pinning layer 120 can include, but are not limited to, NiO and XMn, where X is Pt, PtPd, Ni, Fe, Ir, Rh, or Ru. The pinned layer 130 is preferably a synthetic pinned layer including ferromagnetic layers 132 and 136 separated by a spacer layer 134. The spacer layer 134 is preferably Ru. The thickness of the spacer layer is selected such that the ferromagnetic layers 132 and 136 are antiferromagnetically coupled. However, nothing prevents the use of another type of pinned layer 130, such as a simple pinned layer. The nonmagnetic spacer layer 140 is preferably a conductor, such as Cu. In another embodiment, the nonmagnetic spacer layer 140 may be an insulator. In such an embodiment, the nonmagnetic spacer layer 140 is sufficiently thin to act as a tunneling barrier. The free layer 150 is preferably a bilayer. Such a free layer 150 includes a CoFe layer 152 and a NiFe layer 154. However, nothing prevents the use of other materials, a simple free layer, or a synthetic free layer for the free layer 150 not inconsistent with the present invention.

Figure 1:
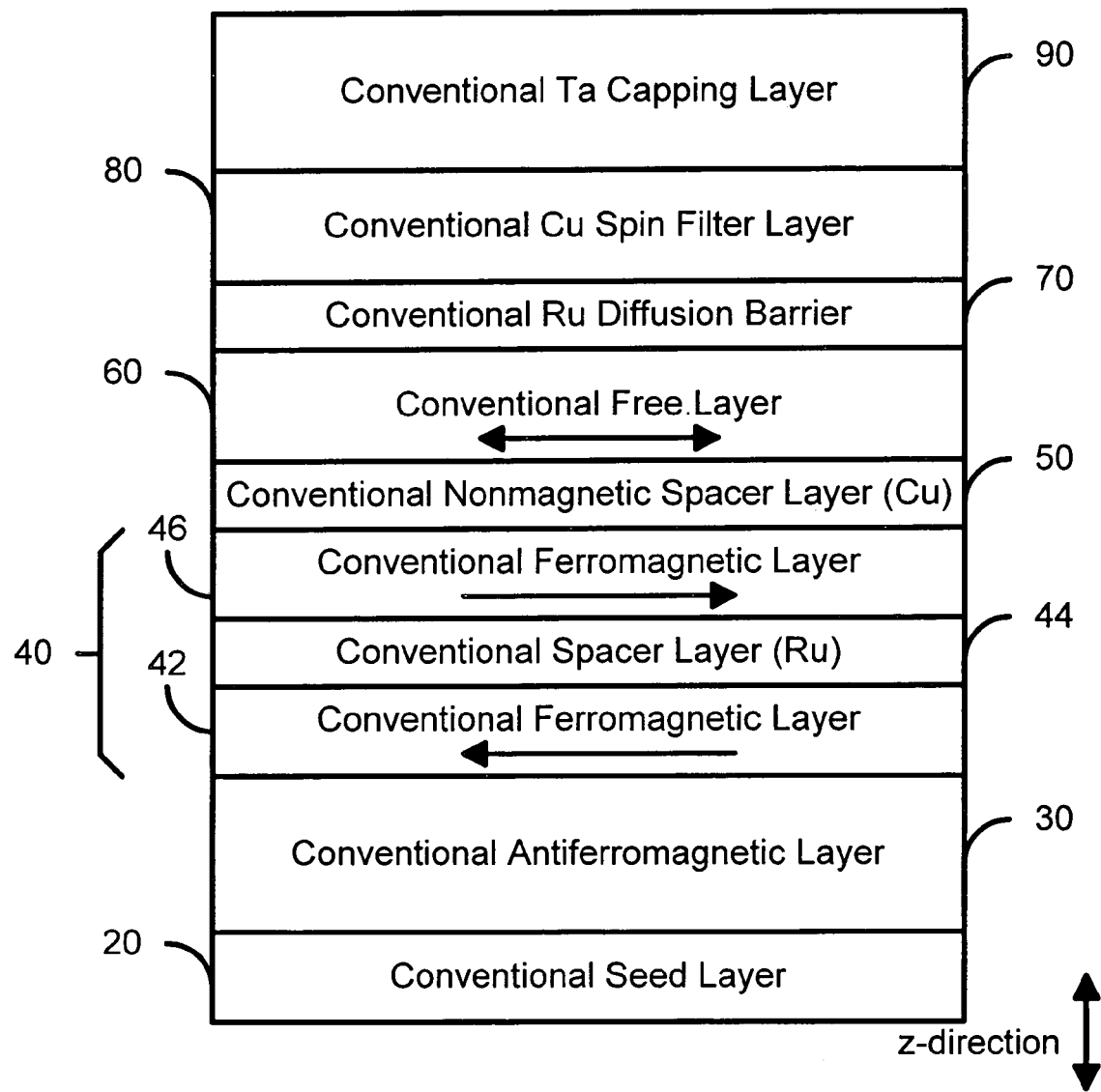
FIG. 1 is a diagram of a conventional spin filter.

The spin filter 100 also includes a spin filter layer 160 and a capping layer 170 in accordance with the present invention. The spin filter layer 160 has a low resistance in comparison to the free layer 150 and is thermally stable. The spin filter layer 160 also preferably does not dramatically change the resistance of the spin filter 100 from that of the conventional spin filter 10 depicted in FIG. 1. Also in a preferred embodiment, the spin filter layer 160 does not degrade the signal output and thus preserves the magnetoresistance ($\Delta R/R$) and change in resistance of the conventional spin filter 10. Referring back to FIG. 2, the spin filter layer 160 includes Pt and/or Rh. In a preferred embodiment, the spin filter layer 160 is composed of Pt. Also in a preferred embodiment, the spin filter layer 160 is at least eight Angstroms thick, as discussed below.

The capping layer 170 is configured to include a specular reflection layer 172. The capping layer 170 is preferably formed upon exposure of the spin filter 100 including the capping layer 170 to oxygen or nitrogen. For example, if the capping layer 170 is deposited as a Ta layer, the specular reflection layer 172 may be $Ta_2O_5$ formed by oxidizing the Ta layer. The specular reflection layer 172 allows specular reflection of current carriers traveling from the spin filter layer 160 to the specular reflection layer 170. In a preferred embodiment, the specular reflection layer 172 includes at least one material selected from a group consisting of Ta, Ti, Zr, Hf, Nb, Al, Mo, W, Si, Cr, V, Ni, Co, Fe. Thus, the specular reflection layer 172 may include an alloy of one or more of the materials Ta, Ti, Zr, Hf, Nb, Al, Mo, W, Si, Cr, V, Ni, Co, Fe. For example, the specular reflection layer 172 may include FeTi or FeTa. The specular reflection layer 172 is preferably an oxide or nitride of materials including at least one of Ta, Ti, Zr, Hf, Nb, Al, Mo, W, Si, Cr, V, Ni, Co, Fe.

The spin filter 100 having the combination of the spin filter layer 160 and capping layer 170 including the specular reflection layer 172 has improved thermally stability and performance. Because of the use of the specular reflection layer 160 including Pt and/or Rh, the thermal stability of the spin filter 100 is improved. The capping layer 170 including the specular reflection layer 172 in combination with the spin filter layer 160 having the appropriate thickness enables the spin filter 100 to have the desired signal without the adversely affecting the sheet resistance and inter-layer coupling field. Consequently, both the performance and the thermal stability of the spin filter 100 are improved. Moreover, it is noted that the spin filter 100 may be used in either a CPP or CIP (current in plane) configuration.

Figure 3A:
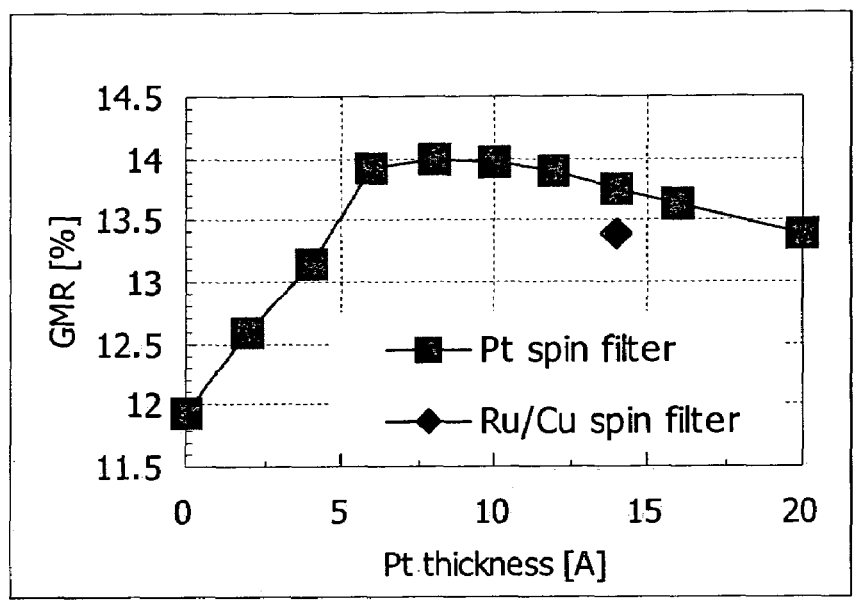
FIG. 3A is a graph depicting the magnetoresistance versus spin filter layer thickness for one embodiment of a spin filter in accordance with the present invention compared with the magnetoresistance of a conventional spin filter.
Figure 3B:
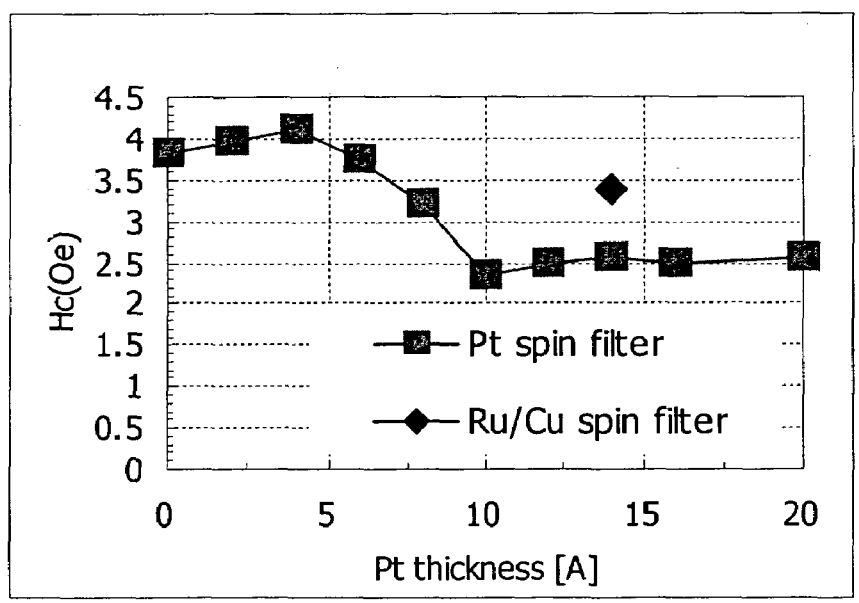
FIG. 3B is a graph depicting the coercivity versus spin filter layer thickness for one embodiment of a spin filter in accordance with the present invention compared with the magnetoresistance of a conventional spin filter.
Figure 3C:
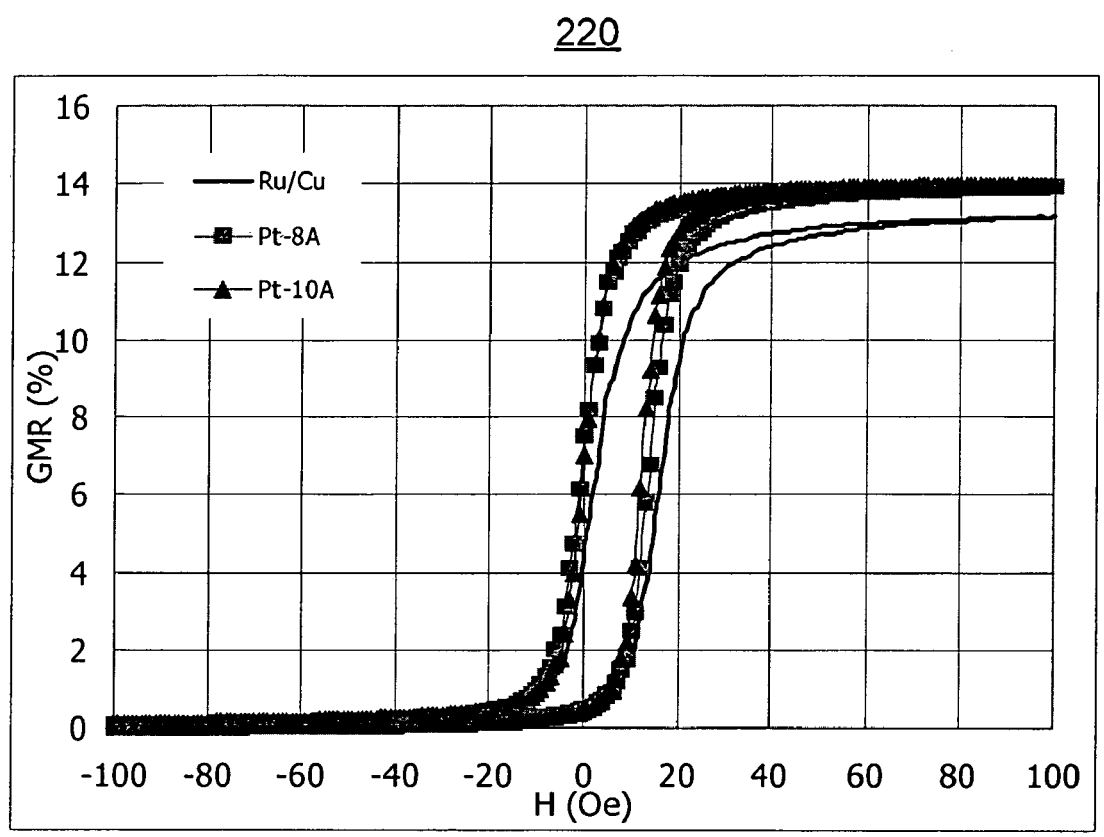
FIG. 3C is a graph depicting the minor magnetoresistance transfer curve versus spin filter layer thickness for one embodiment of a spin filter in accordance with the present invention compared with the magnetoresistance of a conventional spin filter.

FIGS. 3A-3C are graphs 200, 210, and 220 illustrating the improved performance of embodiments of the spin filter 100. The graphs 200, 210, and 220 are for spin filters 100 having spin filter layers 160 composed of Pt. FIG. 3A is a graph 200 depicting the magnetoresistance versus spin filter layer 160 thickness for one embodiment of a spin filter 100 in accordance with the present invention compared with the magnetoresistance of a conventional spin filter 10. As can be seen in the graph 200, magnetoresistance is improved for spin filter layer 160 thicknesses above approximately six Angstroms. FIG. 3B is a graph 210 depicting the coercivity versus spin filter layer 160 thickness for one embodiment of a spin filter 100 in accordance with the present invention compared with the magnetoresistance of a conventional spin filter 10. As can be seen from the graph 210, the coercivity of the spin filter 100 is no greater than the coercivity of the conventional spin filter 10 for thicknesses of the spin filter layer 160 greater than approximately eight Angstroms. FIG. 3C is a graph 220 depicting the minor magnetoresistance transfer curve versus spin filter layer thickness for one embodiment of a spin filter 100 in accordance with the present invention compared with the magnetoresistance of a conventional spin filter 10. The graph 220 illustrates the improvement in sensitivity of the transfer curve for a device where the spin filter layer 160 is at least eight Angstroms thick.

Thus, the spin filter 100 having the combination of the spin filter layer 160 and capping layer 170 including the specular reflection layer 172 has improved thermally stability and performance for spin filter layer 160 thicknesses of at least eight Angstroms. One explanation for the dramatic improvement at thicknesses of at least eight Angstroms is that the Pt spin filter layer 160 may function as an improved diffusion barrier. However, the method and system in accordance with the present invention do not depend upon a particular explanation for the improvement in performance.

Figure 4:
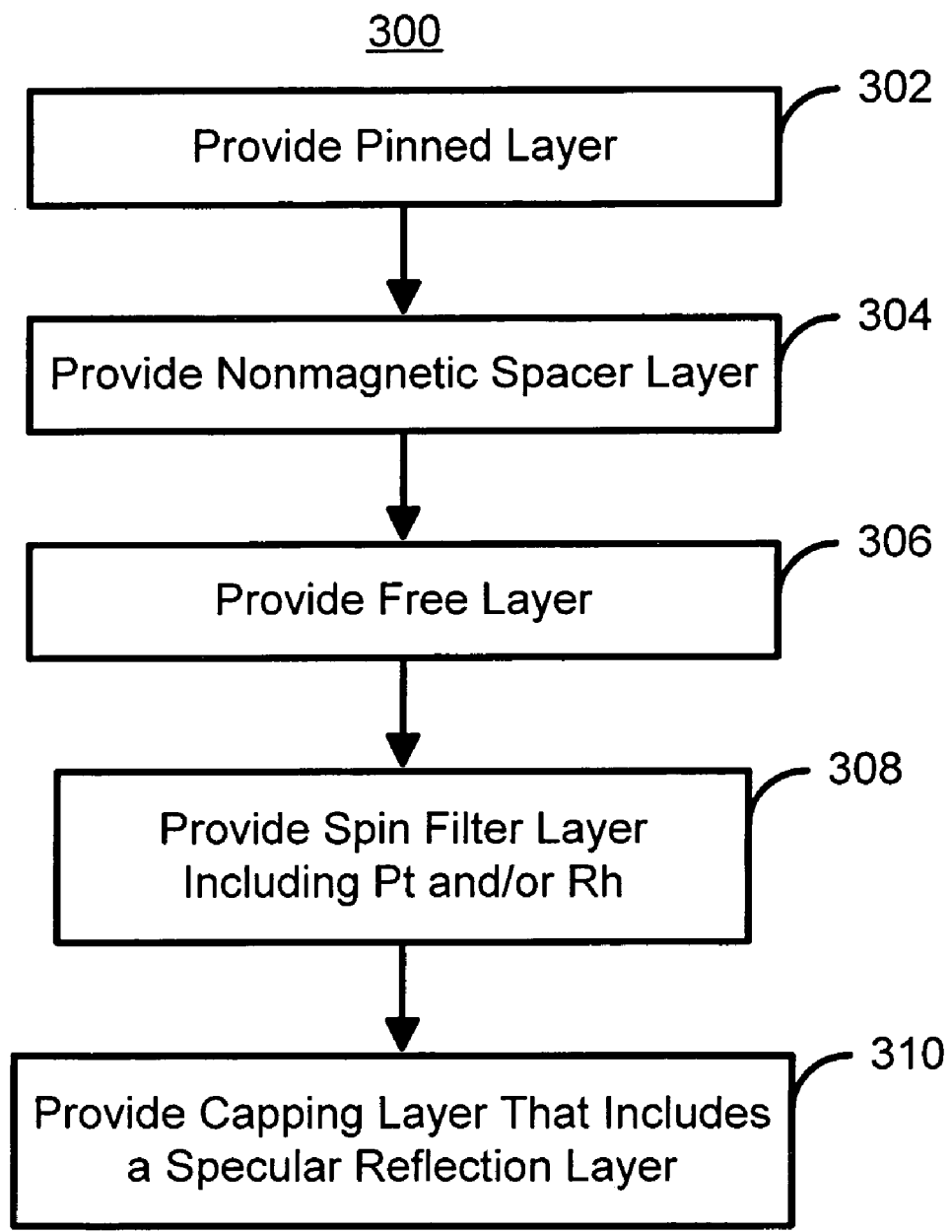
FIG. 4 is a high-level flow chart depicting one embodiment of a method for a more stable spin filter in accordance with the present invention.

FIG. 4 is a high-level flow chart depicting one embodiment of a method 300 for a more stable spin filter in accordance with the present invention. The method 300 is described in the context of the spin filter 100. However, nothing prevents the use of the method 300 with another spin filter consistent with the present invention. The method 300 preferably commences after the pinning layer 120 has been provided. The pinned layer 130 is provided, via step 302. Step 302 preferably includes providing the ferromagnetic layers 132 and 136, as well as the spacer layer 134. The nonmagnetic spacer layer 140 is provided, via step 304. Step 304 preferably includes providing a conductive layer, such as Cu. However, in an alternate embodiment, an insulator forming a tunneling barrier is provided in step 304. The free layer 150 is provided such that the nonmagnetic spacer layer 140 resides between the free layer 150 and the pinned layer 130, via step 306. The spin filter layer 160 is provided, via step 308. Step 308 fabricates the spin filter layer 160 such that the free layer 150 is between the spin filter layer 160 and the nonmagnetic spacer layer 140. The spin filter layer 160 provided in step 308 includes Pt and/or Rh and is preferably provided by sputtering. A capping layer 170 is provided on the spin filter layer 160, via step 310. The capping layer 170 provided in step 310 has a specular reflection layer 172 therein. The specular reflection layer 172 is configured to allow specular reflection of current carriers traveling from the spin filter layer 160 to the specular reflection layer 172. Preferably, the specular reflection layer 172 is formed by oxidizing or nitriding a material including one of the following Ta, Ti, Zr, Hf, Nb, Al, Mo, W, Si, Cr, V, Ni, Co, Fe.

Using the method 300, the spin filter 100 can be provided without unduly altering conventional processes. Consequently, the benefits of the spin filter 100 including improved thermal stability, signal, and sensitivity may be achieved.

A method and system has been disclosed for providing a more stable spin filter. The spin filter in accordance with the present invention may also have improved signal without sacrificing coercivity and sheet resistance. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A spin filter comprising:
  a pinned layer;
  a free layer;
  a nonmagnetic spacer layer residing between the pinned layer and the free layer, the nonmagnetic spacer layer being conductive;
  a spin filter layer adjacent to the free layer and on an opposite side of the free layer as the nonmagnetic spacer layer, the spin filter layer including at least one material selected from the group consisting of Pt and Rh;
  a capping layer on the spin filter layer, the capping layer having a metallic layer and a specular reflection layer, the metallic layer residing between the spin filter layer and the specular reflection layer, the specular reflection layer configured to allow specular reflection of current carriers traveling from the spin filter layer to the specular reflection layer.

2. A spin filter comprising:
  a pinned layer;
  a free layer;
  a nonmagnetic spacer layer residing between the pinned layer and the free layer, the nonmagnetic spacer layer being conductive;
  a spin filter layer adjacent to the free layer and on an opposite side of the free layer as the nonmagnetic spacer layer, the spin filter layer including Pt and/or Rh;
  a capping layer on the spin filter layer, the capping layer having a specular reflection layer therein, the specular reflection layer including at least one oxidized or nitrided material selected from a group consisting of Ta, Ti, Zr, Hf, Nb, Al, Mo, W, Si, Cr, V, Ni, Co, and Fe;
  wherein the capping layer further includes a metallic portion, the metallic portion residing between the spin filter layer and the specular reflection layer.

3. The spin filter of claim 2 wherein the nonmagnetic spacer layer includes Cu.

4. The spin filter of claim 2 wherein the pinned layer further includes:
  a first ferromagnetic layer having a first magnetization;
  a second ferromagnetic layer having a second magnetization;
  a nonmagnetic conductive spacer layer between the first ferromagnetic layer and the second ferromagnetic layer, the nonmagnetic conductive spacer layer having a thickness configured to allow the first magnetization and the second magnetization to be aligned antiparallel.

5. The spin filter of claim 4 wherein the nonmagnetic conductive spacer layer further includes Ru.

6. The spin filter of claim 2 further comprising:
  a pinning layer adjacent to the pinned layer, the pinning layer for pinning a magnetization of the pinned layer in a particular direction.

7. The spin filter of claim 6 wherein the pinning layer is an antiferromagnet.

8. The spin filter of claim 2 wherein the oxidized or nitrided material is selected from a group consisting of Ta, Ti, Zr, Hf, Nb, Mo, W, V, Ni, Co, and Fe.

9. The spin filter of claim 2 wherein the spin filter layer includes Rh.

10. A method for providing a spin filter comprising:
  (a) providing a pinned layer;
  (b) providing a nonmagnetic spacer layer;
  (c) providing a free layer, the nonmagnetic spacer layer residing between the pinned layer and the free layer, the nonmagnetic spacer layer being conductive;
  (d) providing a spin filter layer adjacent to the free layer and on an opposite side of the free layer as the nonmagnetic spacer layer, the spin filter layer including at least one material selected from the group consisting of Pt and Rh;

(e) providing a capping layer on the spin filter layer, the capping layer having a metallic layer and a specular reflection layer, the metallic layer residing between the spin filter layer and the specular reflection layer, the specular reflection layer configured to allow specular reflection of current carriers traveling from the spin filter layer to the specular reflection layer.

11. A method for providing a spin filter comprising:
providing a pinned layer;
providing a nonmagnetic spacer layer;
providing a free layer, the nonmagnetic spacer layer residing between the pinned layer and the free layer, the nonmagnetic spacer layer being conductive;
providing a spin filter layer adjacent to the free layer and on an opposite side of the free layer as the nonmagnetic spacer layer, the spin filter layer including at least one material selected from the group consisting of Pt and Rh;
providing a capping layer on the spin filter layer, the capping layer having a specular reflection layer therein, the specular reflection layer including at least one oxidized or nitrided material selected from a group consisting of Ta, Ti, Zr, Hf, Nb, Al, Mo, W, Si, Cr, V, Ni, Co, and Fe;
wherein the step of providing the capping layer further includes
providing a metallic portion, the metallic portion residing between the spin filter layer and the specular reflection layer.

12. The method of claim 11 wherein the step of providing the nonmagnetic spacer layer further includes:
providing a Cu layer.

13. The method of claim 11 wherein the step of providing the pinned layer further includes:
providing a first ferromagnetic layer having a first magnetization;
providing a nonmagnetic conductive spacer layer
providing a second ferromagnetic layer having a second magnetization, the nonmagnetic conductive spacer layer residing between the first ferromagnetic layer and the second ferromagnetic layer, the nonmagnetic conductive spacer layer having a thickness configured to allow the first magnetization and the second magnetization to be aligned antiparallel.

14. The method of claim 13 wherein the step of providing the nonmagnetic conductive spacer layer further includes:
providing a Ru layer.

15. The method of claim 11 further comprising:
providing a pinning layer adjacent to the pinned layer, the pinning layer for pinning a magnetization of the pinned layer in a particular direction.

16. The method of claim 15 wherein the pinning layer is an antiferromagnet.

17. The method of claim 11 wherein the step of providing the spin filter layer further includes:
providing a layer including Rh.

18. The method of claim 11, wherein the oxidized or nitrided material is selected from a group consisting of Ta, Ti, Zr, Hf, Nb, Mo, W, V, Ni, Co, and Fe.

19. The method of claim 11 wherein the step of providing the capping layer further includes:
depositing a metallic layer including at least one of Ta, Ti, Zr, Hf, Nb, Mo, Al, W, Si, Cr, V, Ni, Co, and Fe; and
oxiding or nitriding at least a portion of the metallic layer to form the specular reflection layer.

20. A spin filter comprising:
a pinned layer;
a free layer;
a nonmagnetic spacer layer residing between the pinned layer and the free layer, the nonmagnetic spacer layer being conductive;
a spin filter layer adjacent to the free layer and on an opposite side of the free layer as the nonmagnetic spacer layer, the spin filter layer including Pt and/or Rh;
a capping layer on the spin filter layer, the capping layer having a specular reflection layer therein, the specular reflection layer including at least one oxidized or nitrided material selected from a group consisting of Ta, Ti, Zr, Hf, Nb, Al, Mo, W, Si, Cr, V, Ni, Co, and Fe;
wherein the oxidized or nitrided material is selected from a group consisting of Zr, Hf, Nb, Mo, W, V, Ni, Co, and Fe.

21. A method for providing a spin filter comprising:
providing a pinned layer;
providing a nonmagnetic spacer layer;
providing a free layer, the nonmagnetic spacer layer residing between the pinned layer and the free layer, the nonmagnetic spacer layer being conductive;
providing a spin filter layer adjacent to the free layer and on an opposite side of the free layer as the nonmagnetic spacer layer, the spin filter layer including at least one material selected from the group consisting of Pt and Rh;
providing a capping layer on the spin filter layer, the capping layer having a specular reflection layer therein, the specular reflection layer including at least one oxidized or nitrided material selected from a group consisting of Ta, Ti, Zr, Hf, Nb, Al, Mo, W, Si, Cr, V, Ni, Co, and Fe;
wherein the oxidized or nitrided material is selected from a group consisting of Zr, Hf, Nb, Mo, W, V, Ni, Co, and Fe.

* * * * *